United States Patent
Montanari et al.

[11] Patent Number: 6,115,285
[45] Date of Patent: Sep. 5, 2000

[54] DEVICE AND METHOD FOR MULTI-LEVEL CHARGE/STORAGE AND READING OUT

[75] Inventors: Donato Montanari, Antwerp; Jan Van Houdt, Bekkevoort; Guido Groeseneken, Leuven; Herman Maes, Bierbeek, all of Belgium

[73] Assignee: Siemens Aktiengesellschaft, Munich, Germany

[21] Appl. No.: 09/202,481

[22] PCT Filed: Feb. 7, 1997

[86] PCT No.: PCT/EP97/00561

§ 371 Date: Dec. 14, 1998

§ 102(e) Date: Dec. 14, 1998

[87] PCT Pub. No.: WO97/48099

PCT Pub. Date: Dec. 18, 1997

Related U.S. Application Data

[60] Provisional application No. 60/019,812, Jun. 14, 1996, and provisional application No. 60/020,037, Jun. 21, 1996.

[51] Int. Cl.$^7$ .................................................. G11C 16/04
[52] U.S. Cl. .............................. 365/185.03; 365/185.2; 365/185.26
[58] Field of Search ........................ 365/185.29, 185.03, 365/185.2, 185.26, 185.28, 185.14, 185.01

[56] References Cited

U.S. PATENT DOCUMENTS

| | | | |
|---|---|---|---|
| 4,415,992 | 11/1983 | Adlhoch | 365/94 |
| 4,532,535 | 7/1985 | Gerber et al. | 375/23.5 |
| 4,558,344 | 12/1985 | Perlegos | 375/59 |
| 4,616,245 | 10/1986 | Topich et al. | 375/23.5 |
| 4,649,520 | 3/1987 | Eitan | 365/185 |
| 4,670,675 | 6/1987 | Donoghue | 307/530 |
| 4,771,404 | 9/1988 | Mano et al. | 365/189 |
| 5,043,940 | 8/1991 | Harari | 365/168 |
| 5,073,513 | 12/1991 | Lee | 437/43 |
| 5,163,021 | 11/1992 | Mehrotra et al. | 365/185 |
| 5,291,439 | 3/1994 | Kauffmann et al. | 365/185 |
| 5,298,808 | 3/1994 | Terrell et al. | 307/475 |
| 5,418,743 | 5/1995 | Tomioka et al. | 365/189.01 |
| 5,422,845 | 6/1995 | Ong | 365/185 |
| 5,583,810 | 12/1996 | Van Houdt et al. | 365/185.15 |
| 5,583,811 | 12/1996 | Van Houdt et al. | 365/185.15 |
| 5,753,950 | 5/1998 | Kojima | 257/315 |
| 5,841,697 | 11/1998 | Van Houdt et al. | 365/185.14 |

FOREIGN PATENT DOCUMENTS

| | | |
|---|---|---|
| 0 501 941 A1 | 9/1992 | European Pat. Off. |
| 0756287 | 1/1997 | European Pat. Off. |
| WO 93/25005 | 12/1993 | WIPO |
| WO 95/34074 | 12/1995 | WIPO |
| WO 95/34075 | 12/1995 | WIPO |

OTHER PUBLICATIONS

Etiemble et al., "Coneption Avec Regles En Lambda D'une Rom 4–Valuee", Revue de Physique Appliquee, vol. 20, No. 2, pp. 71–75.

*Primary Examiner*—David Nelms
*Assistant Examiner*—Thong Le
*Attorney, Agent, or Firm*—Hill & Simpson

[57] ABSTRACT

The present invention discloses a memory device having memory cells capable of storing three or more charge leves in said memory cell. The cells can be programmed according to a method including a single pulse charge level injection mechanism in said cells. The method does not require a program verify scheme, permits increased speed during programming, and reduces the area necessary for storing one bit of information. The memory device of the present invention further includes information write or storage or programmation means, information erase means and information read-out means. Another object of the present invention is to provide a method and a circuit that implements said method for determining the charge level of a memory cell having t possible levels (t being larger than or equal to three). The circuit measures the similarity of the memory cell drain current with the drain current of each of n references, determines the one reference which is the most similar to the memory cell and thereby identifies the charge level of said memory cell.

15 Claims, 12 Drawing Sheets

| Level | $V_T$ (V) | | $I_D$ (μA) | |
|---|---|---|---|---|
| | X | σ | X | σ |
| 0 | -3.92 | 0.27 | 195 | 12 |
| 1 | -1.72 | 0.06 | 91 | 2 |
| 2 | -0.89 | 0.09 | 43 | 9 |
| 3 | 2.60 | 0.18 | 0 | 0 |
FIG. 3a
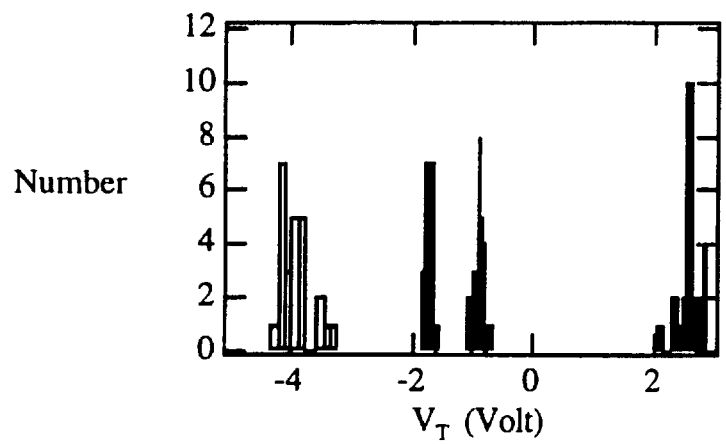
FIG. 3b
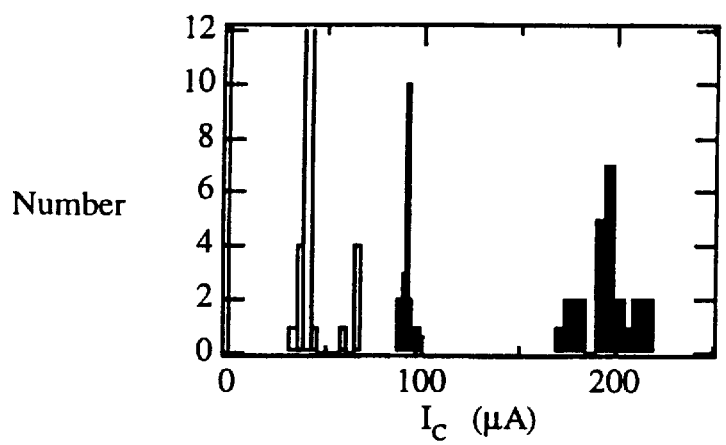
FIG. 3c

DEVICE AND METHOD FOR MULTI-LEVEL CHARGE/STORAGE AND READING OUT

This application is a 371 of PCT/EP97/00561 filed Feb. 7, 1997 also claims the benefit of U.S. Provisional application Ser. No. 60/019,812 filed Jun. 14, 1996 and Provisional Ser. No. 60/020,037 filed Jun. 21, 1996.

BACKGROUND OF THE INVENTION

Field of the Invention

The present invention relates generally to a non volatile memory device for multi-level charge storage. In particular, a device and a method for multilevel charge storage and an apparatus and a method for reading out from the storage device is disclosed.

Description of the Related Art

Non-volatile semiconductor memory devices are an important class of solid-state memory devices. A particular type of non-volatile semiconductor memory devices are flash EEPROM devices. The primary mechanism by which data are stored in a non-volatile memory device is by access to a memory cell. The demand for high-density Flash EEPROM memory devices in portable computing and telecommunication applications stimulates continuous efforts on scaling of flash EEPROM memory cell size. In order to further increase the storage capability of Flash memory devices, Multi-Level Charge Storage (MLCS) techniques have been developed. These techniques allow further reductions in the cost per bit of information of flash EEPROM non-volatile memory devices.

Typically, a MLCS memory device is configured such that $2^n$ different charge levels, corresponding to threshold voltage levels, can be stored in one memory cell and the current corresponding to these different threshold voltage levels can be read-out. Thus, storage and read-out of n bits of data (with n being larger than or equal to two) in a single memory cell can be achieved. The cost per bit of information with MLCS techniques is reduced as a number related to 1/n.

Multi-level storage or write or progammation circuits and techniques, and read-out circuits and techniques have been disclosed. U.S. Pat. No. 5,043,940 of Harrari discloses a split-channel EEPROM device that can be programmed in more than two programmable threshold states. U.S. Pat. No. 4,771,404 of Mano et al. discloses a memory device which has memory cells capable of storing ternary or more information. This memory device includes a multilevel detector for detecting the information of the memory cells at one time and a reference generator for generating reference levels therefor. U.S. Pat. No. 5,163,021 of Mehrotra et al. discloses improvements in the Circuits and Techniques for read, write and erase of Multi-State EEPROM memory devices, the improved circuits making the reading relative to a set of threshold levels as provided by a corresponding set of reference cells. U.S. Pat. No. 4,415,992 discloses a read-out scheme for discriminating n charge levels of a memory cell in which (n-1) comparators and (n-1) voltage references are used in parallel to determine the charge level of the memory cell. Additional decoding logic is required to translate the outputs of the comparators into bits. A total of (2n - 1) different voltage amplitudes are necessary, and have to be implemented on chip. Other multilevel storage memory devices and programming methods have been disclosed in PCT published application WO95/34074, U.S. Pat. No. 5,422,845 and PCT published patent application WO95/34075.

A main disadvantage applying to the memory devices disclosed in the prior art is that they, in functioning, make use of a bit-by-bit program verification procedure. This procedure suffers from trade-offs between accuracy of the stored levels and programming speed. Consequently the programming operation slows down. Moreover, the chip implementation of the verification procedure increases the chip dimensions. Furthermore, the memory devices reported in the prior art employ read-out circuits based on a plurality of comparators and decoding logic which not only increase the complexity of the memory device but also enlarge the chip dimensions.

The prior art memory cells for multi-level charge storage employ programming methods based on either Fowler Nordheim Tunneling (FNT) or Channel Hot Electron (CHE) injection. The prior art multi-level programmming methods utilize a 'program verify scheme' comprising the following common steps:

(1) A programming pulse of typically 100 microseconds to 1 millisecond duration is applied to the memory cell to be programmed;

(2) The drain current of the memory cell to be programmed is sensed and presented to a comparator circuit which also has presented to it the current of a reference current source corresponding to one of the multilevel charge levels to which the cell has to be programmed;

(3) If the current of the memory cell and the current of the reference current source match, then the cell is in the correct state and no further programming is required. If however the currents do not match, then steps (1) and (2) are repeated.

The prior art programming methods fail to disclose a MLCS method characterized by high programming speed and small chip'size required to implement the memory device. Since according to the prior art programming methods several iterations of the programming steps are required, and after each step a sensing step is required in order to accurately program the cell to the intended charge level, the speed of the entire programming operation is significantly compromised. The speed furthermore is a function of the particular charge level that has to be programmed. These disadvantages considerably decrease the data throughput of the memory device. The second problem has to do with silicon area consumption, since the silicon implementation of the 'program verify scheme' increases the chip size.

SUMMARY OF THE INVENTION

It is an object of the present invention to provide a memory device having memory cells which are capable of storing three or more charge levels in the memory cell. The memory cells can be programmed according to a method including a single pulse charge level injection mechanism in the cells. The method does not require a charge level verify scheme, permits increased speed during programming, and reduces the area necessary for storing one bit of information. The speed of the programming mechanism is at least two orders of magnitude faster than other multi-level programming mechanisms described in the prior art. The memory device of the present invention further includes information write or information storage or information programmation means, information erase means and information read-out means. It is to be understood in the following that the terms writing or storage or programming specify equivalent methods or circuits or means.

Yet another object of the present invention is to provide a method and an apparatus and circuit that implements the method for reading out the charge level of a memory cell having t possible states (t being larger than or equal to three). The circuit measures the similarity of the drain current of the memory cell with the drain current of each of m references, stored in dummy cells, determines the one reference which is the most similar to the memory cell and thereby identifies the charge level of the memory cell.

In one aspect of the present invention, a memory device adapted for multi-level charge storage is disclosed. The memory device comprises a plurality of flash EEPROM memory cells and further comprises means for programming the charge levels and readout means for parallel outputting binary data corresponding to the charge levels stored in the cells. Preferably the memory cells of the memory device comprise in a semiconductor substrate a source region, a drain region, and a channel region. The memory cell further comprises a floating gate, the floating gate including first and second floating gate portions, the first portion extending over the channel region, the second portion extending away from the channel region. The memory cells further include a program gate and a control gate, the program gate forming a capacitor with the second floating gate portion. The programming means of the memory device furthermore comprise means for applying a high voltage pulse with a predetermined amplitude, selected from a plurality of predetermined amplitudes and with an essentially fixed time width to the cells. The predetermined amplitudes determine the charge levels. The charge levels correspond to different threshold voltage levels of one memory cell. The memory cells of the memory device preferably are arranged in an array with rows and columns having the drains of the cells belonging to the same column connected together thereby forming a data output line, the program gates of the cells belonging to the same column connected together thereby forming a data input line. The control gates of the cells belonging to the same row furthermore can be connected together thereby forming a word line.

In a second aspect of the present invention is disclosed a method of storing one of a plurality of charge levels in a memory cell including a source region, a drain region, a channel region and a floating gate, the floating gate including first and second floating gate portions, the first portion extending over the channel region, the second portion extending away from the channel region, the memory cell further including a program gate and a control gate, the program gate forming a capacitor with the second floating gate portion. The method comprises the steps of applying a low voltage to the control gate; applying a voltage not greater than 5 Volts to the drain region; and applying a high voltage pulse with a predetermined amplitude, selected from a plurality of predetermined amplitudes and with an essentially fixed time width to the program gate, the predetermined amplitudes determining the charge levels. The method further comprises the step of capacitively coupling said high voltage pulse to the second floating gate portion, thereby causing a hot-electron injection towards the floating gate whereby one of the plurality of charge levels is stored in the memory cell.

In another aspect of the present invention, a method is disclosed of making uniform the electrical field stress induced by programming to different charge levels the memory cells of the array of the memory device according to the present invention. The method comprises the steps of applying a low voltage to the control gates of essentially each of the memory cells of the array; applying a voltage not greater than 5 Volt on the drain regions of essentially each of the memory cells of the array; and applying a high voltage pulse with a predetermined amplitude and an essentially fixed time width on the program gates of essentially each of the cells of the array; and thereafter erasing the cells.

Yet in another aspect of the present invention, a method of reading out the charge level of a memory cell of the memory device according to the present invention is disclosed. The method comprises the steps of sensing the drain current of the memory cell; sensing the drain currents of a plurality of duiruny cells; measuring the similarities between the drain current of the memory cell and the drain currents of the plurality of dummy cells thereby obtaining a plurality of intermediate voltages representing the similarities; determining the highest among the intermediate voltages thereby identifying the dummy cell having the drain current closest to the drain current of the memory cell; and setting a predetermined voltage on one of a plurality of output terminals, the one output terminal corresponding to the dummy cell having the drain current closest to the drain current of the memory cell.

In a further aspect of the present invention an apparatus or circuit is disclosed for reading out the charge level of a memory cell. The apparatus comprises a plurality of dummy cells for delivering a plurality of reference currents; means for reading out the reference currents and the current of the memory cell; a plurality of analog circuits for measuring the similarity between the current of the memory cell and each of the reference currents whereby outputting a plurality of intermediate voltages representing the similarities; a decision circuit for determining the highest among the intermediate voltages thereby determining the dummy cell having the drain current with the smallest distance from the drain current of the memory cell and for setting a predetermined voltage on one of a plurality of output terminals, the one output terminal corresponding to the dummy cell having the drain current with the smallest distance from the drain current of the memory cell.

BRIEF DESCRIPTION OF THE DRAWINGS

FIGS. 3a and 3c are a table and two graphs of the threshold voltages and read-out currents of cells programmed acoording to the Voltage Variant Source Side Injection method of the present invention.

DETAILED DESCRIPTION OF THE PREFERRED EMBODIMENTS

It is an object of the present invention to provide a memory device having memory cells capable of storing three or more charge levels. The cells can be programmed according to a method including a single charge level injection mechanism in the cells. The method does not require a program verify scheme, permits increased speed during programming, and reduces the area necessary for storing one bit of information. The speed of the programming mechanism is at least two orders of magnitude faster than other multi-level programming mechanisms described in the prior art. The memory device of the present invention further includes information write means, information erase means and information read-out means.

For the purpose of teaching only, in the following description, an implementation of the memory device and method of storing data in the memory device will be described for the case where $2^n$ different threshold voltage levels can be stored in a memory cell, with n=2. It is apparent that, according to the teachings of the invention, other embodiments of this invention can be configured by the person of skill in the art for n>2, the spirit and scope of the present invention being limited only by the terms of the appended claims.

Figure 1A:
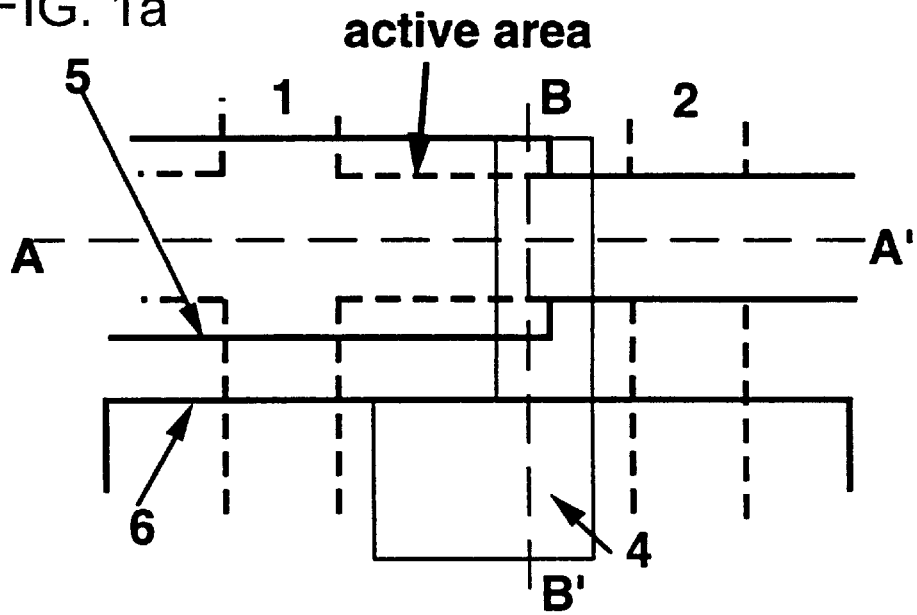
FIGS. 1a, 1b and 1c are schematic plan view and two sectional views of a memory cell according to a preferred embodiment of the invention.
Figure 1B:
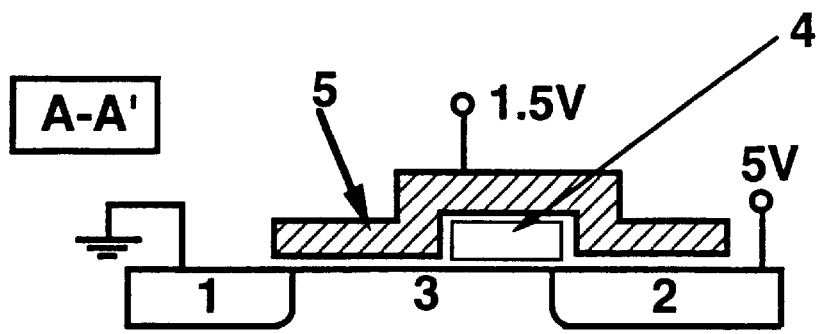
Figure 1C:
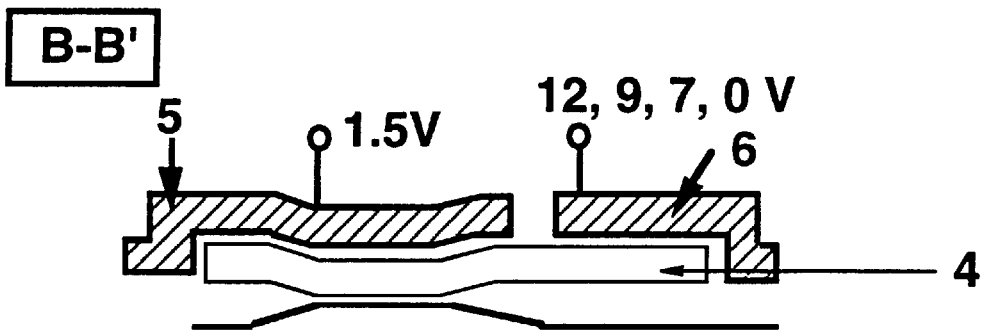

FIGS. 1a, 1b and 1c show a memory cell of the memory device according to a preferred embodiment of the invention. The memory cell is a flash EEPROM cell structure implemented in a silicon substrate and comprises a source region 1, a drain region 2 and a channel region 3 therebetween. The memory cell further comprises a floating gate 4, the floating gate including first and second floating gate portions, the first portion extending over the channel region 3 with a thin oxide layer therebetween, the second portion extending away from the channel region. The memory cell further includes a program gate 6 and a control gate 5, the program gate 6 forming a capacitor with the second floating gate portion, the control gate 5 extending over the first portion of the floating gate. The program gate 6 forms a capacitor with the floating gate 4 with a high coupling ratio of about 50% or more. A dielectric layer is in between the program gate 6 and the floating gate and in between the control gate and the floating gate. In detail the structure and a possible programming mechanism of the memory cell is disclosed in U.S. Pat. No. 5,583,811, in U.S. Pat. No. 5,583,810 and in the EP Patent No. EP 0501941. The teaching of these patent documents U.S. Pat. No. 5,583,810, U.S. Pat. No. 5,583,811, and European Patent Document EP 0501941 is incorporated herein by reference. This memory cell can be implemented in a 3 $\mu$m, or in a 1.2 $\mu$m, or in a 0.7 $\mu$m, or in a 0.5 $\mu$m, or in a 0.35 $\mu$m or in a 0.25 $\mu$m or in a 0.18 $\mu$m or in a 0.12 $\mu$m Complementary Metal-Oxide-Semiconductor (CMOS) silicon technology, or in any other CMOS technology with the set of layout rules and characteristic dimensions of the transistors according to the art. The memory cell according to the preferred embodiment of the present invention, when implemented in a 0.7 $\mu$m CMOS technology can have the floating gate 4, the program gate 6 and the control gate 5 being made of polysilicon material. The dielectric layer can be an oxide layer with a thickness of 25–30 nm. The thin oxide layer can have a thickness ranging from 7–9 nm. The floating gate length and the control gate length can be 0.7 $\mu$m, the width of the memory cell can be 1.8 $\mu$m.

Figure 2:
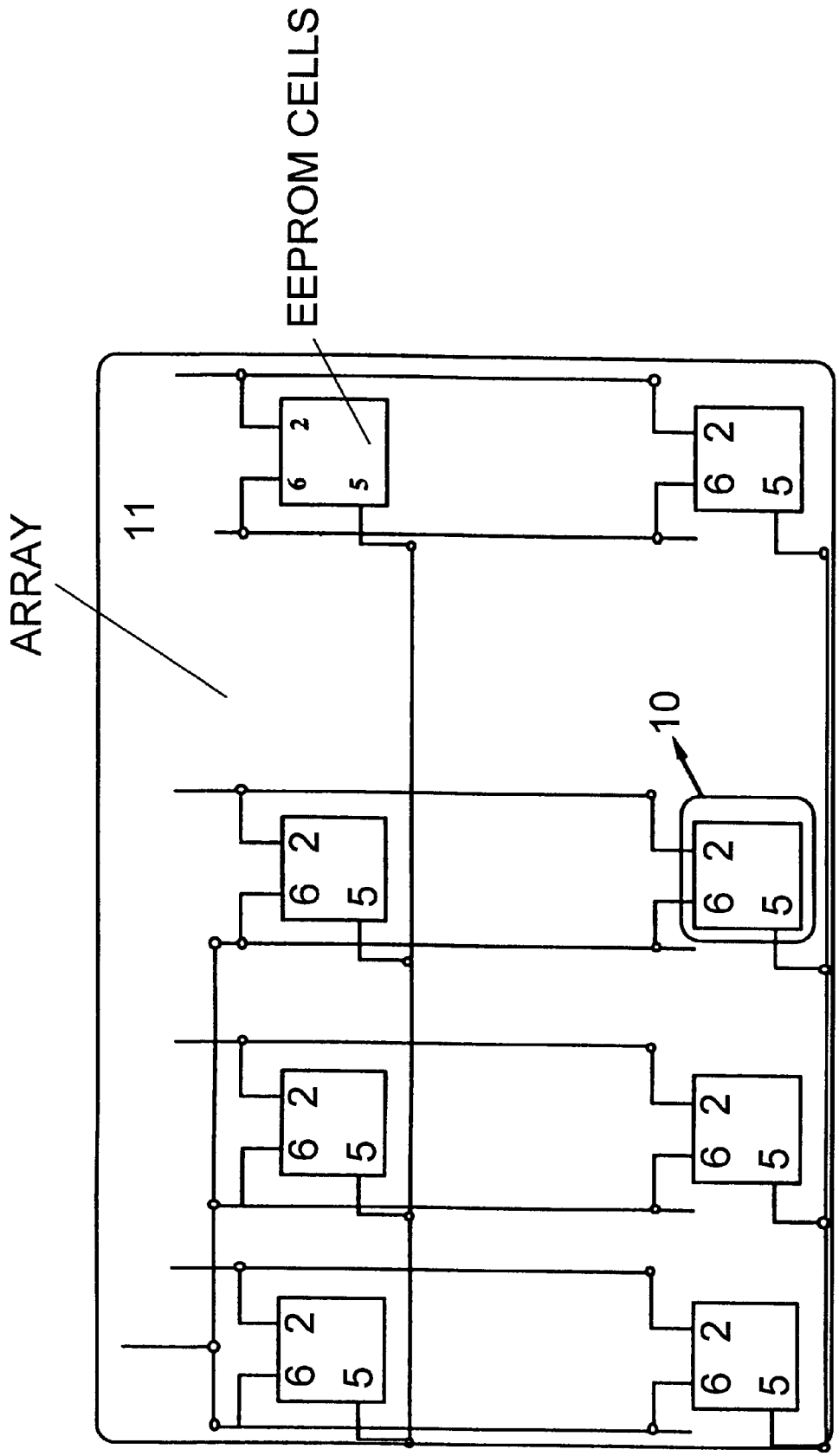
FIG. 2 is a block diagram which shows an array of memory cells according to a preferred embodiment of the invention.

The memory device preferably comprises an array of cells as detailed hereabove. FIG. 2 illustrates an array configured in accordance with one embodiment of the present invention. The array is a geometric configuration of individually addressable EEPROM cells 10 as disclosed hereabove. Thus the memory cells have a Control Gate 4, a Program Gate 6, a Drain region 2 and a Source region 1. The source 1 of all cells in the array is grounded and therefore not shown in FIG. 2. The memory array 11 is arranged in m rows and z columns. Each cell belongs to one column and to one row only. The last four cells of each row are dummy cells which are used as references during the read-out operation of the memory device. Along each row, a word line is connected to all the Control Gates 5 of the cells in the row. Along each column, an output bitline is connected to all the Drains 2 of the cells. An input bitline is connected to all the Program Gates 6 of the cells in the column. Thus, the Program Gate 6 is routed in the same direction as the Drain region 2. The Control Gate 5 is routed in a direction perpendicular determined by the one of the Program Gate and the Drain. The Program Gates have to be routed by preference in parallel to the Drain regions in a Multilevel Array. In a Binary Array on the other hand, the program gates have to be routed horizontally. Since in the Voltage Variant Source Side Injection (VVSSI) muli-level programming method disclosed in the present patent application, the data to be programmed into the cells are applied on the Program Gate whereas the data to be read-out from the cells are sensed from the Drain, it follows that the Drain and the Program Gate of the cells have to be routed in the same direction in order to allow individual programming and read-out of each cell. In this Multilevel Flash EEPROM Array there are two bitlines. The output bitline is used to read out the charge storage levels from the cells, and the input bitline is used to program the charge storage levels into the cells.

In an aspect of the present invention, a method of storing one of a plurality of charge levels in the memory cell is disclosed. A difference between the memory cells for multi-level charge storage reported in the prior art and the memory cell structure according to the preferred embodiment of the invention is that the prior art memory cells require programming schemes based on either Fowler Nordheim Tunneling (FNT) or Channel Hot Electron (CHE) injection whereas the memory cell according to this preferred embodiment of the invention employs a Voltage Variant Source Side Injection Programming method (VVSSI). This new programmation method is based on a Source Side Injection (SSI) programmation method of the memory cell. Each of the multi-level charge storage levels corresponds to a specific threshold voltage that is stored into the Floating Gate 4 of the EEPROM memory cell. The threshold voltage of the memory cell is defined as the voltage that must be applied on the program gate 6 in order to obtain a drain current of 1 $\mu$m at a fixed value of the control gate voltage and the drain region voltage. This definition is different from other non-volatile memory cells for which the threshold voltage of the device must be defined at the control gate.

The SSI programmation method devolves on applying a high voltage to the program gate 6, thereby capacitively coupling a high voltage to the floating gate 4, applying a low voltage to the control gate 5 and applying a voltage not greater than 5 Volts to the drain region thereby causing a very high hot-electron injection towards the floating gate 4 while achieving a programming of the memory cell. VVSSI multi-level charge level programming comprises the steps of applying a single programming pulse ($V_{PG}$) to the program gate 6 of the cell, while the drain region 2 and control gates 4 are kept at a constant bias ($V_D$ and $V_{CG}$) according to the conditions of Table 1. The programming pulse which is applied to the program gate 6 of the memory cell, has a width T of about 1 microsecond independently of the charge level to be programmed, and an amplitude which, on the contrary, is related to the charge level to be programmed as shown in Table 1. The amplitude of the programming pulse is given in Volts (V)

TABLE 1

Operating Conditions of the multi-level charge storage programmation method according to a preferred embodiment of the present invention.

|  | Level | VCG (V) | VPG (V) | VD (V) | T |
|---|---|---|---|---|---|
| VVSSI | 1 | 1.5 | 7.0 | 5.0 | 1.0 μs |
|  | 2 | 1.5 | 8.0 | 5.0 | 1.0 μs |
|  | 3 | 1.5 | 12.0 | 5.0 | 1.0 μs |
|  | 0 | 1.5 | 0.0 | 5.0 | 1.0 μs |
| READ-OUT | ALL | 4.0 | 0.0 | 2.0 |  |

The values given in table 1 are related to the implementation of the memory cell of the preferred embodiment in a 0.7 μm CMOS technology. As it is shown in 10 Table 1, the value of $V_D$ (namely 5 V) is the value of the power supply voltage of the 0.7 μm CMOS technology. If the power supply voltage is to be scaled down for other CMOS technologies as mentioned above (e.g. to 3.3 Volt for a 0.35 μm CMOS technology) the values of the different voltages reported in Table 1 can change as follows. $V_D$ would scale down as the power supply voltage, the different $V_{PG}$ voltages would scale down as a subtraction that is approximately equal to the double of the amount by which the power supply voltage is diminished; $V_{CG}$ would be in the range of 0.5–1.3 Volts. $V_{CG}$ for a 0.7 μm CMOS technology can be in the range of 1.5 to 1 Volt or even lower. For instance, in the case of a supply voltage scaling from 5 to 3.3 Volts, $V_D$ would be 3.3 Volts; $V_{PG}$ would be about 9 Volts, 6 Volts, 5 Volts and 0 Volt for the different charge storage levels. For a 0.7 μm CMOS technology, the $V_{PG}$ voltages as reported in table 1 can also be different. A set of programming voltages as 10 Volts, 8 Volts, 6 Volts and 0 Volt for the different charge storage levels can be used. The set of programming voltages as given in table 1 are a good compromise between the requirements of programming speed on one hand, and accuracy of the programmed charge level on the other. Taking the pulse width of the programming pulse (VpG) longer than or equal to 1 micro second ensures that all the levels are taken in the saturation region of the respective programming characteristics. Therefore, the pulse width of 1 micro second is optimal for VVSSI. The programming characteristic of a memory cell is defined as the shift of the threshold voltage of the memory cell versus the programming time. As the time width of the pulse is concerned, it can remain about the same with the scaling down of the CMOS technology and power supply. This is certainly an advantage, because next generation VVSSI based EEPROM memory devices would be smaller in area but not slower than the embodiment in a 0.7 μm CMOS technology.

Thus, the a method of storing one of a plurality of charge levels in the memory cell utilizes a single 1 micro second programming pulse and does not require a program verify scheme to verify the accuracy of the programmed charge storage levels. In the following, the programming performance, capability for information discrimination and endurance characteristics are explained in detail. The speed of the programming mechanism is at least two orders of magnitude faster than other multi-level programming mechanisms based on FNT described in the prior art as for instance in M. Ohkawa et al. "A 98 mm² 64 Mb Flash Memory with FN-NOR type 4-level Cell", ISSCC 96, TP 2.3, pg.36. A much larger current window is the main advantage of VVSSI with respect to CHE.

40 of the EEPROM memory cells fabricated on a 6-inch silicon wafer in a 0.7 μm CMOS technology have been programmed to the four levels according to the conditions mentioned in Table 1. The distributions of these levels, in terms of Threshold Volage $V_T$ and Read-Out Current $I_D$, have been measured and are shown in FIG. 3. Also shown in FIG. 3 are the mean value X, and the standard deviation s for each distribution. The cells have been measured according to the read-out conditions shown in Table 1. It is evident that the distributions are narrow and separated one from another. Thus the method of storing one of a plurality of charge levels according to the present invention does not require a program verify scheme to verify the accuracy of the programmed charge storage levels.

Figure 4:
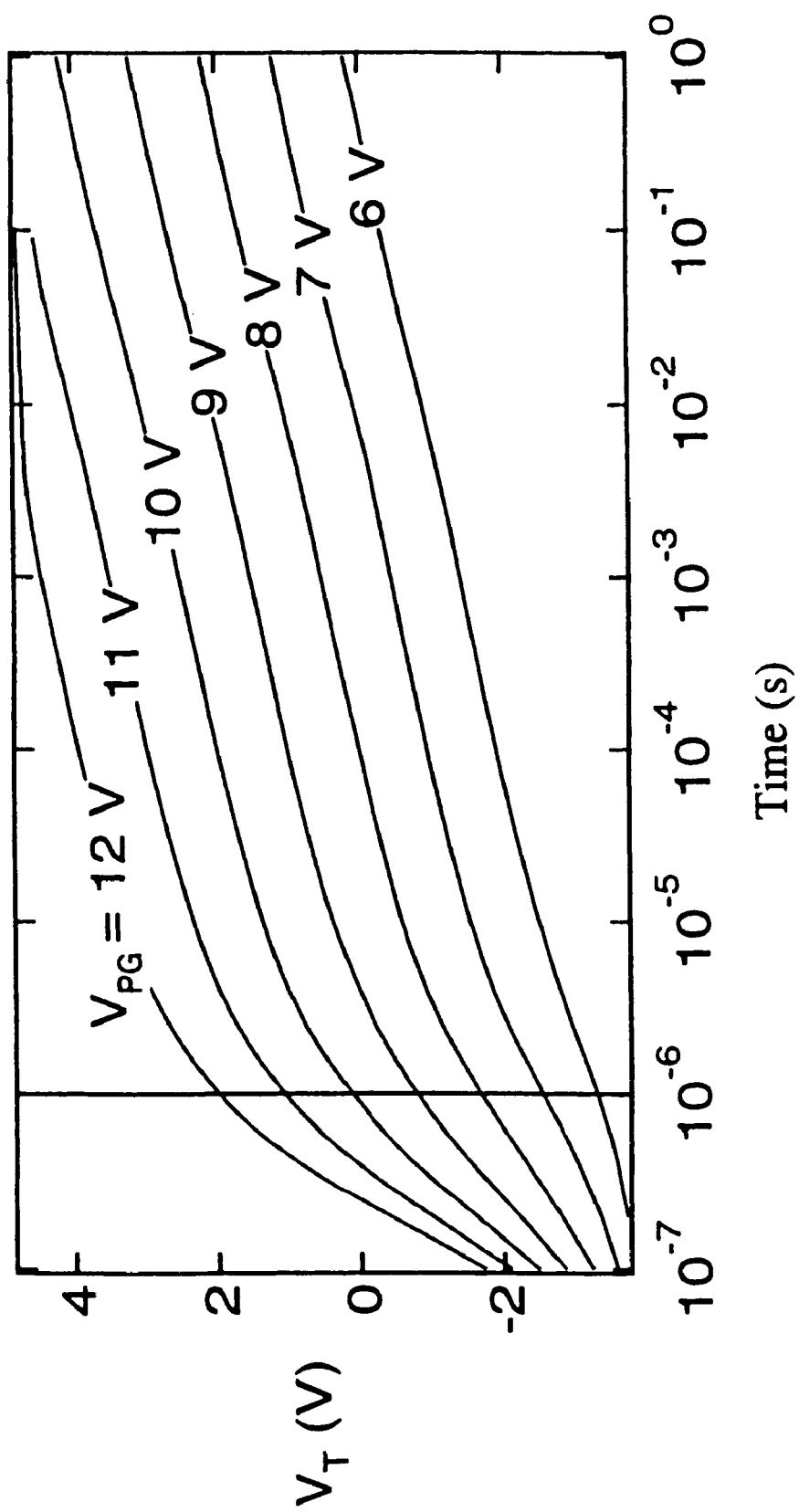
FIG. 4 is a graph which shows the programming characteristics of Voltage Variant Source Side Injection.

An advantage of programming pulses of equal time width 10 but different amplitudes is that the width of the pulse can be chosen in such a way that all the levels are located in the same region of the respective programming characteristics. In fact, in this particular case, 1 microsecond is the minimum time required for all the levels to end up in the saturation region of the transient characteristic, as can be understood from FIG. 4

In order to program the EEPROM memory cell according to the MLCS method according to the present invention, the memory cell by preference is erased beforehand. Level 0 as mentioned in Table 1, in fact, is the erased state of the EEPROM memory cell according to the preferred embodiment of the present invention. Whereas the VVSSI programming pulses corresponding to logic levels 1, 2, and 3 according to Table 1, shift the threshold voltage of the floating gate of the memor4' cell by injecting into the floating gate an amount of charges which is proportional to the amplitude of the programming pulse, on the other hand the programming pulse corresponding to logic level 0 does not shift the threshold voltage since the amplitude of such pulse is zero. To erase the EEPROM memory cell according to the preferred embodiment of the present invention, a method comprising the following two steps is introduced:

(1) A pre-erase programming pulse is applied to the EEPROM memory cell according to a preferred embodiment of the present invention.

(2) An erase pulse is applied to the EEPROM memory cell. The erase pulse can be applied in different ways.

First, a method of applying the pre-erase pulse is discussed. In order to minimize the effects of cycling, the electrical field induced stress on the devices should be kept as uniform as possible. Unfortunately in Multilevel memory devices this stress is a function of the data stored in the device. For instance, the stress that is built up in a memory cell that has been programmed ten times to level 3 will be much higher than the stress in another memory cell that has been programmed nine times to level 0 and once to level 1. The non-uniform nature of this stress results in non-predictable shifts of the read-out currents, which greatly compromise the charge storage level discrimination capability of the memory device. This problem can be overcome by applying an additional write pulse before the erase operation. As can be understood from the transient characteristic of SSI, shown in FIG. 4, a 10 microsecond pre-erase programming pulse of the highest voltage (12 Volt), brings all the devices to the same high $V_T$ state before the erase operation, regardless of the initial $V_T$ stored inside the cell.

Second, a method of applying an erase pulse to the EEPROM memory device is discussed. The following options can be chosen. Erasure can be accomplished in 5 different ways:

1) Fowler-Nordheim tunneling of electrons from the floating gate towards the drain junction is activated by applying a high negative voltage (−10 to −12 V) to the program gate, while the supply voltage (5 Volts) is applied to the drain. In this erase mode, the control gate has to be kept grounded in order to maximize the tunneling field at the drain-to-floating-gate overlap. The potential applied to the source junction is of no importance during erasure.

2) If the wordline and the program line of a sector of the memory device are connected during the erase operation, a lower gate voltage can suffice (typically −7 to −8 V). The parasitic control-gate-to-floating-gate capacitance is then used to further enhance the electric field across the tunnel oxide. In this case, the erase mechanism stays essentially the same as in the previous case, but the necessary negative voltage is lowered at the expense of additional switching circuitry.

3) Another possible erase scheme is offered by the channel erase mechanism. In this case a negative voltage is applied to the program line, eventually combined with the supply voltage and applied to the substrate (or p-well) of the memory array. In this case a uniform erase current is obtained in the tunnel oxide region which is beneficial from the point of view of oxide stress and programming window closure after write/erase cycling. The main advantage of this scheme is the absence of any band-to-band tunneling current from the drain junction to the substrate or well.

4) A last possible erase mechanism is the polyoxide conduction from the floating gate to the control gate which can be established by applying a high positive voltage to the control gate. This is possible without any changes to the cell design. This erase scheme has also been described in U.S. Pat. No. 5,583,810. The possible erase modes are summarized in Table 2.

TABLE 2

Typical operating voltages for the memory cell in a SSI write mode, and the different erase modes.

| | source | drain | control gate | program gate | substrate or p-well |
|---|---|---|---|---|---|
| write | 0 V | 3.3 V/5 V | 1 V/1.5 V | 12 V | 0 V |
| tunnel erase | — | 3.3 V/5 V | 0 V | −12 V | 0 V |
| tunnel erase (alternative) | — | 3.3 V/5 V | −7 V | −7 V | 0 V |
| channel erase | 3.3 V/5 V | 3.3 V/5 V | 0 V | −12 V | 3.3 V/5 V |
| channel erase (alternative) | 3.3 V/5 V | 3.3 V/5 V | −7 V | −7 V | 3.3 V/5 V |
| polyoxide erase | — | 0 V | 12 V | 0 V | 0 V |

Read-out Architecture

Figure 5:
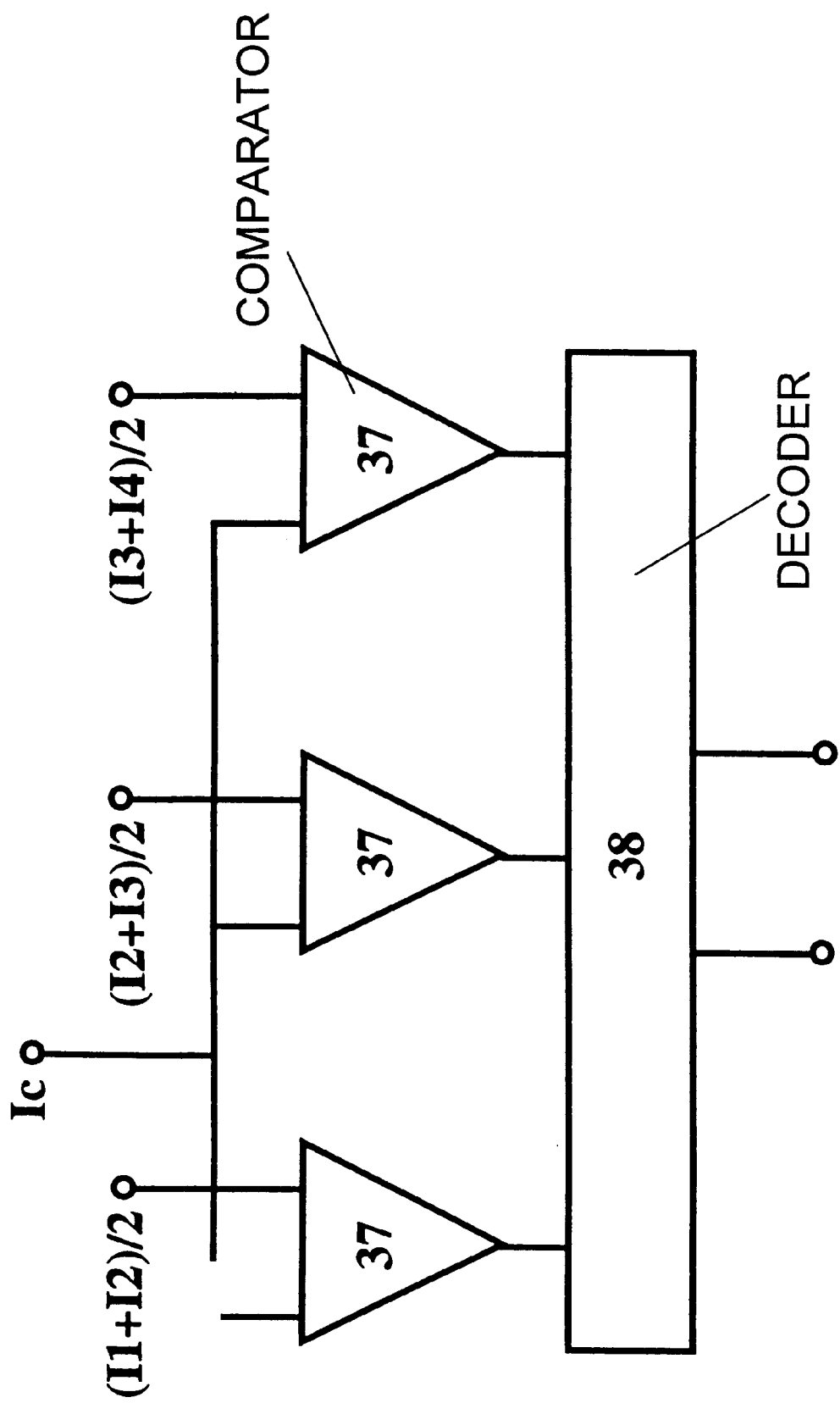
FIG. 5 is a functional block diagram which shows a state of the art Read-out architecture.

The prior art multilevel memory devices rely on a parallel architecture for reading out the information stored in the memeory cell similar to the one shown in FIG. 5. The memory cell read out current 'c is compared in parallel with three reference currents, which are chosen as the average of the currents corresponding to two adjacent logic levels. Each comparator 37 produces a binary output that is fed to a decoder 38 from which the 2 bits of information are obtained. Due to the considerable area cost of the comparators 37, this architecture extensively increases the periphery of the memory device. In fact, while the comparator utilized to distinguish between 0's and 1's is simple and small (1 bit resolution) in binary memories, the comparators in MLCS memory devices need to be much more accurate (8 bits resolution) and, therefore, consume much more area. Furthermore, this architecture is based on the assumption that regardless of wafer distributions of the read out current, process variations, disturbs and cycling, the read out current corresponding to level 'i' will always be larger than reference 'i' and smaller than reference 'I-1'. When this not the case, a comparator would switch, leading to an error in identifying the stored charge level. Such assumption can be made only if programming is achieved utilizing program verify techniques. Since the VVSSI programmation method is not utilizing program verification, a new custom designed architecture has been developed.

In order to minimize the influence of process variations and cycling, four dummy cells $D_0$, D1, D2 and D3 are provided on each row of the memory array described above. These dummy cells are programmed to level 0,1, 2 and 3 respectively, as explained in Table 1, and are utilized as references during the read-out operation.

Figure 6:
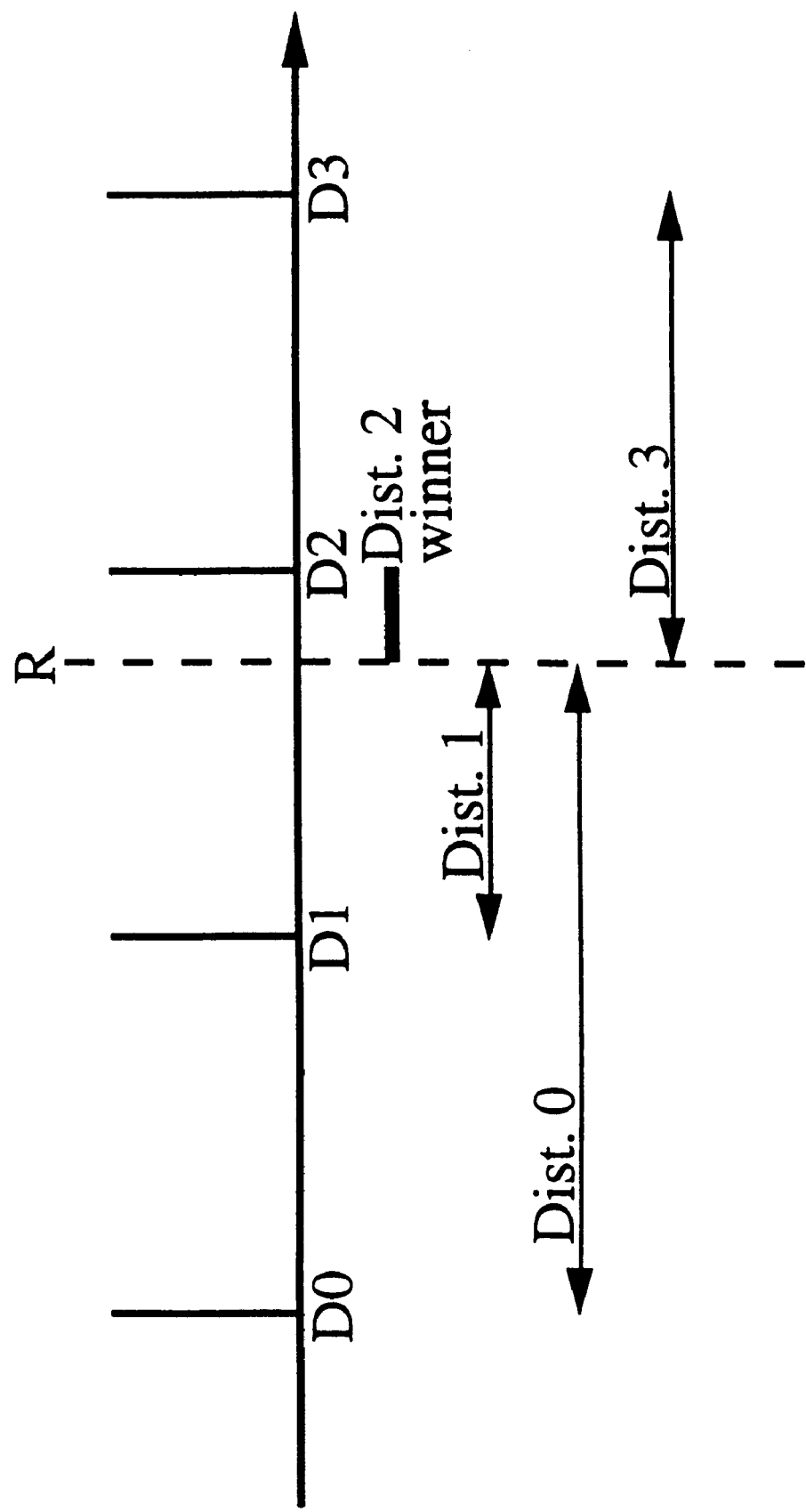
FIG. 6 is a diagram which shows the working principle of the Read-out architecture according to a preferred embodiment of the invention.
Figure 7:
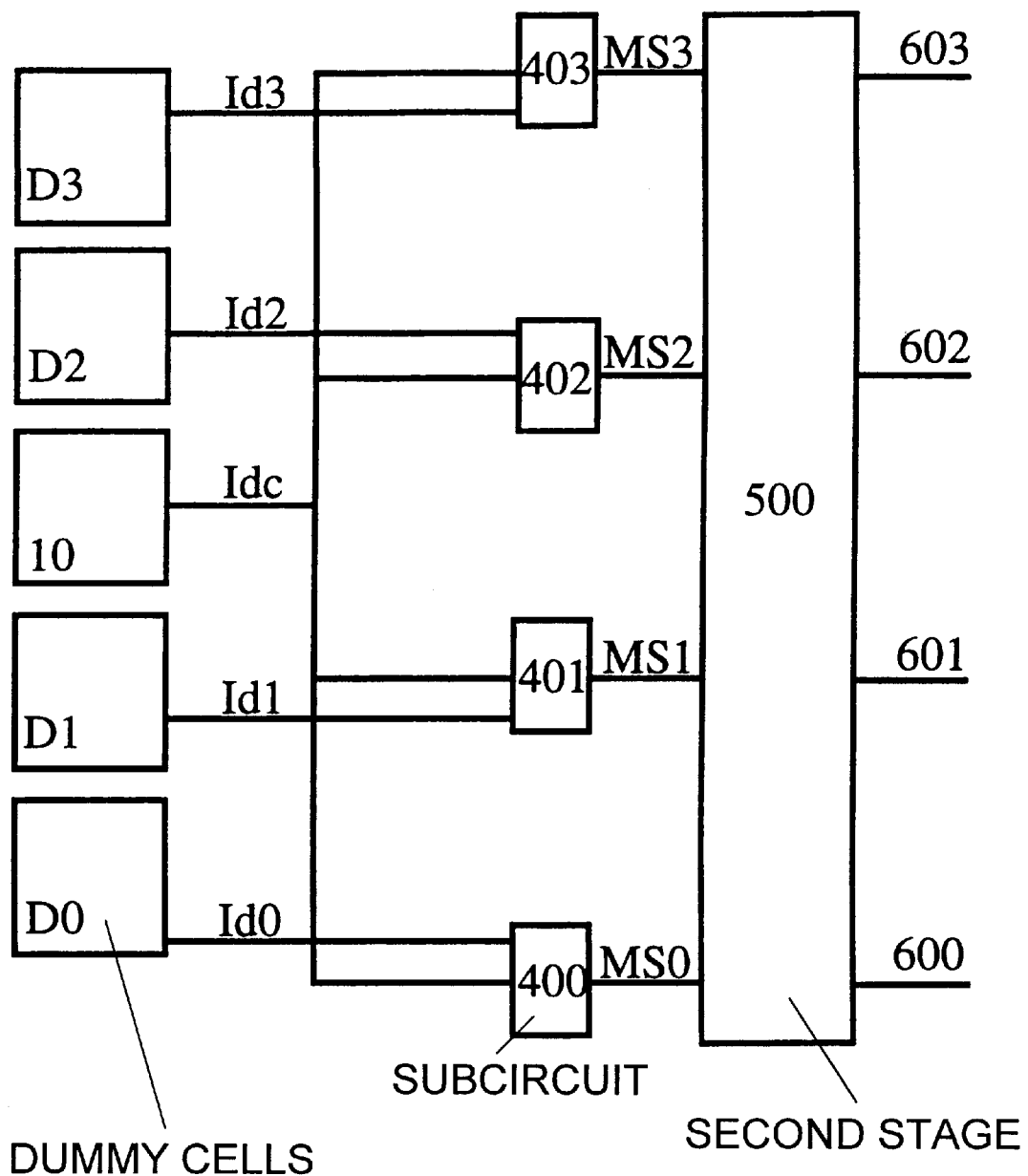
FIG. 7 shows the block diagram of the Read-out architecture according to a preferred embodiment of the invention.

When a memory cell 10 is read-out, its read-out current and the currents of the dummy cells D0, D1, D2 and D3 on that row are sensed in parallel. How to implement the sensing device is well known in the art. The read-out current of the memory cell Idc is then compared with each of the currents Idx of the dummy cells to decide to which of the four charge storage levels (0, 1, 2, 3) it belongs. A dedicated circuit has been implemented to carry out these comparisons in parallel in order to reduce the access time. The circuit working principle and block diagram are shown in FIGS. 6 and 7, respectively. In order to realize the multilevel signal comparison, the distance between the read-out current and each of the currents of the dummy cells is measured by the four subcircuits 400, 401, 402 and 403 of FIG. 7. Each of these produce an intermediate output voltage that is proportional to the similarity of the measured currents: this intermediate output voltage is labeled as the Matching-Score signal (MS). The four MS's are fed to the second stage 500 of the circuit of FIG. 6. This sub-block (500) decides which of the four MS's is the highest and brings the corresponding output terminal (600, 601, 602 or 603) to the high digital state, while the other three outputs remain at the low digital state. The high digital state corresponds to a voltage equal to the power supply voltage, while the low digital state corresponds to ground.

By means of example the subcircuit 400 is described 5 herebelow. The other subcircuits 401, 402 and 403 are similar to 400. The subcircuits 400, 401, 402 and 403 receive two current input signals Ic and Ix and deliver an intermediate voltage output signal VMS that is proportional to the similarity between the two input currents, that is in this preferred embodiment of the invention the smaller the Euclidean distance between the currents, the higher VMS. The monodimensional Euclidean Distance, as known in the art, can be expressed as: where R and L are two generic monodimentional vectors, and VMS is a monotonically decreasing function of Dist. In order to implement expression (1) on silicon, the intrinsic square law of a long channel MOSFET in saturation is exploited:

$$IM \sim K(VGVSV \sim.) \quad (2)$$

Applying a voltage signal (R) to the gate of a MOS is straightforward and known in the art. However, in order to apply a voltage (L) to its source, a second MOSFET in a source follower configuration must be connected to the source of the driving n-MOS device. In this way the expression $(R-L)^2$ is implemented. The so obtained current $I_M$ is then fed to a p-MOS device in a diode configuration which implements the square root function.

Figure 8:
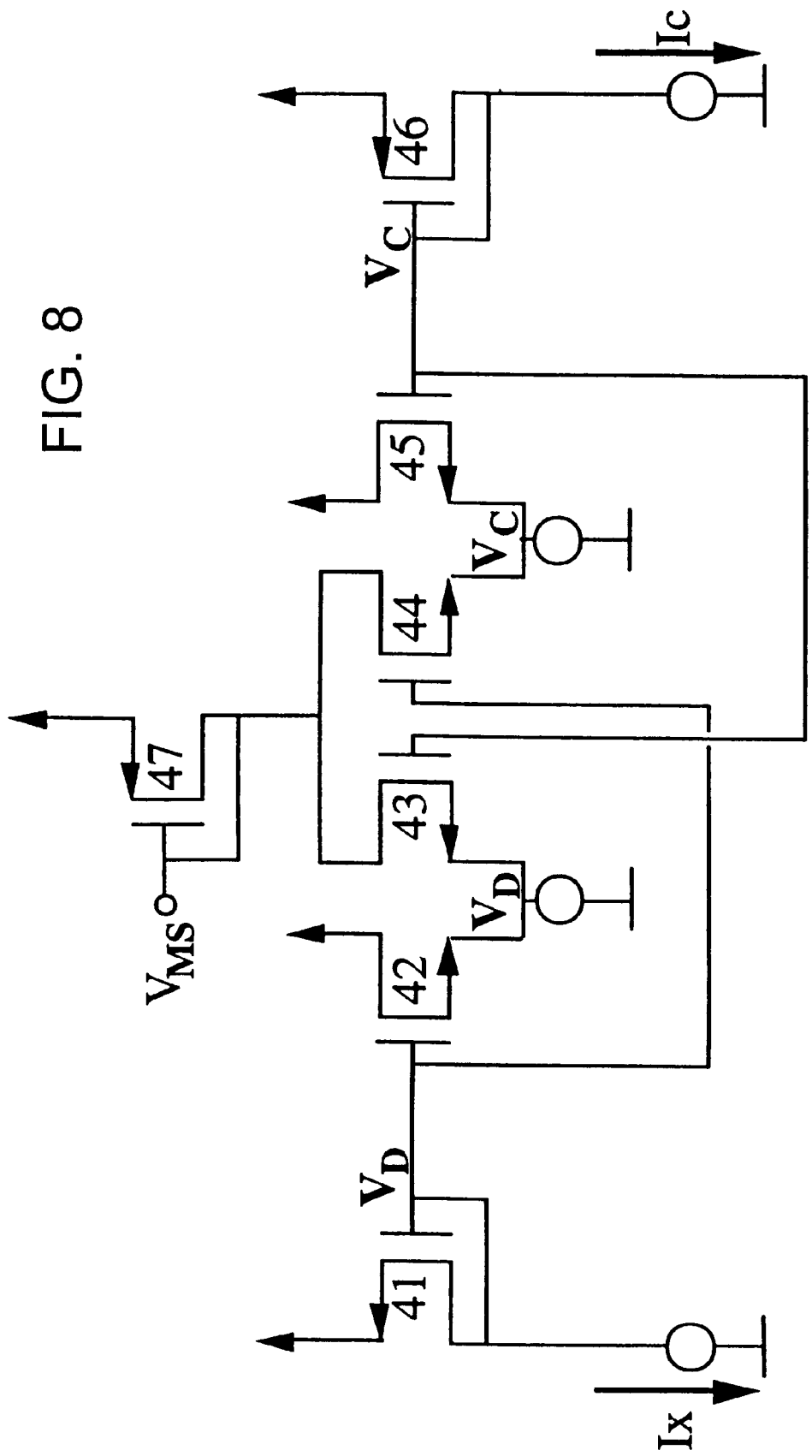
FIG. 8 shows a schematic drawing of subcircuits 400, 401, 402 and 403 of FIG. 7.

These considerations lead to the sub-circuit shown in FIG. 8, which includes two driving n-MOS device 43 and 44 comprising a couple of first driving metal-oxide-semiconductor transistors with the respective source followers 45 and 42 comprising a couple of second metal-oxide-semiconductor transistors, a diode connected p-MOS device 47 comprising a third metal-oxide-semiconductor transistor and two current-to-voltage converter n-MOS device 46 and 41.

One electrode, i. e. source or drain, of each of the second metal-oxide-semiconductor transistors is connected to one electrode, i. e. source or drain, of one of the first driving metal-oxide-semiconductor transistors. Thereby one of the first driving metal-oxide-semiconductor transistors is connected to one of the second metal-oxide-semiconductor transistors. The gates of the first driving metal-oxide-semiconductor transistors and the second metal-oxide-semiconductor transistors thereby are configured in a cross-like configuration. Thereto the gate of each of said first driving metal-oxide-semiconductor transistors is connected to the gate of one of the second metal-oxide-semiconductor transistors, the second metal-oxide-semiconductor transistor being the one that is not connected with one electrode of the first driving metal-oxide-semiconductor transistor. The third metal-oxide-semiconductor transistor is connected to another electrode, i. e. source or drain, of the first driving metal-oxide-semiconductor transistors, these another electrodes of the first driving metal-oxide-semiconductor transistors being connected to one another.

The dimensions of the transistors are given in the figure as well. Components 42 and 45 have an aspect ratio W/L which can be from about 5 to about 50 times that of Components 43 and 44 since these are source follower transistors utilized to bias the source of the driving transistors. However, the wider the source followers with respect to the driving transistor, the more accurately the source follows the gate. Simulations show that a factor of 10 is a good compromise between accuracy and area consumption.

The transistors 46 and 41 convert Ic and Ix into VC and VD respectively. If Ic is larger than Ix, then component 44 is cut off since the voltage at its source VC is higher than the voltage VD at its gate. However, component 43 is on and the larger the difference between VC and VD, the larger its drain current, the smaller VMS. On the contrary, if Ic is smaller than Ix then component 43 is cut off and component 44 is on.

Figure 9:
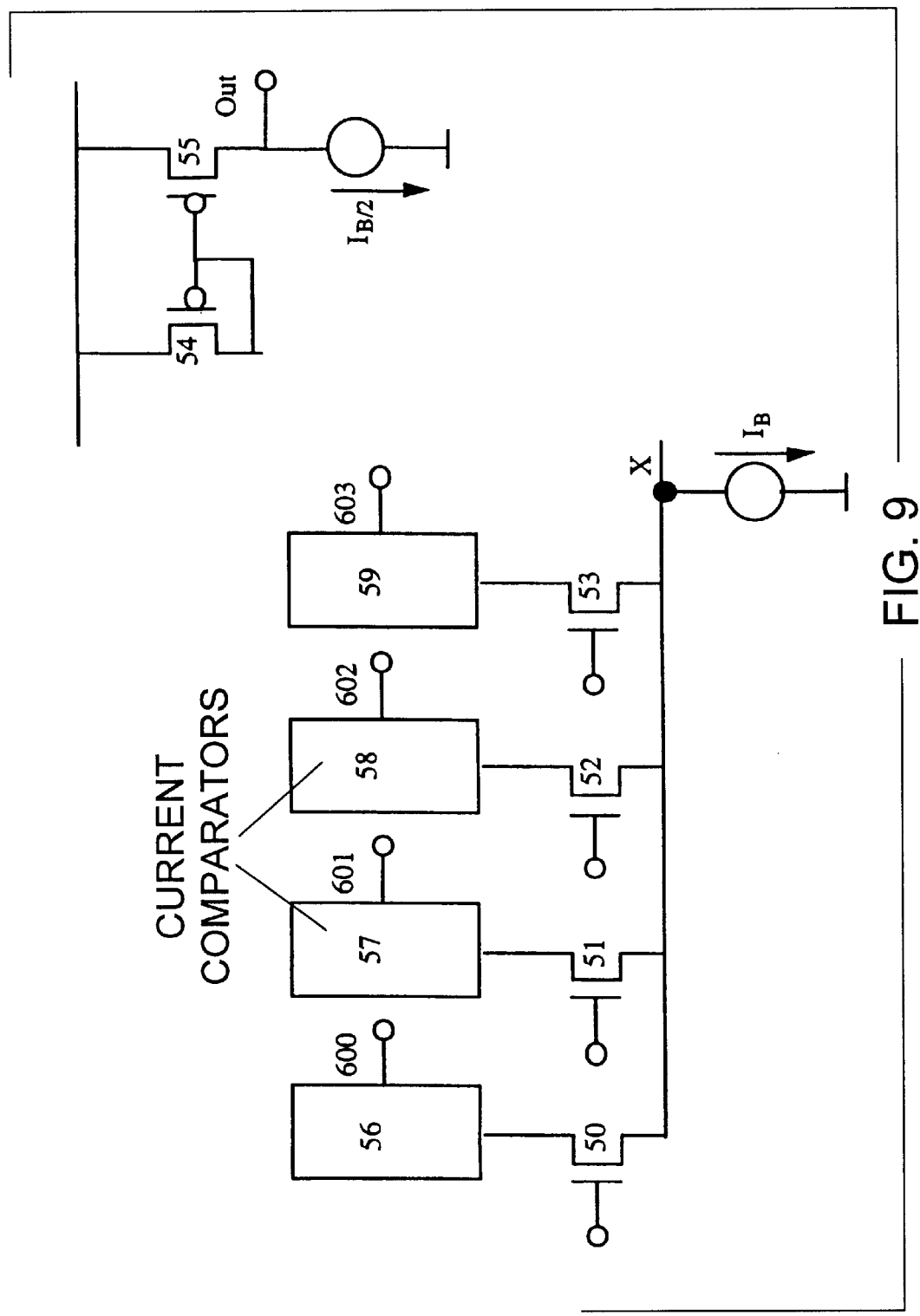
FIG. 9 shows a schematic drawing of subcircuit 500 of FIG. 7.

FIG. 9 shows the proposed sub-circuit 500 according to a preferred embodiment of the invention which comprises 4 current n-MOS conveyors 50, 51, 52 and 53 comprising transistors and 4 current comparators 56, 57, 58 and 59. The sub-circuit receives the four VMS's from the dummy cells D0, D1, D2, D3 as input signals at the gates of the current conveyors and delivers four binary output signals. The current conveyors have the source node X in common and are biased by the same biasing current IB. When the VMS's are applied to the gates of the conveyors, node X follows the largest input voltage, turning off the other three conveyors: the biasing current will flow only through the conveyor with the largest VMS. Only the conveyor with the largest VMS will drive current, while the other three conveyors will not. The drain of each of the conveyors is connected to the drain of transistor 54 of the current comparator which is on top of the conveyor. The current comparator, that is implemented according to principles known in the art, compares the current coming from the conveyor with the bias current 1B/2. If the current coming from the conveyor is larger than 1B/2, then the output of the comparator will be high. If, on the other hand, the current coming from the conveyor is smaller than the bias current 1B/2, then the output of the comparator will be low. Since the current 'B flows almost entirely in one and only one of the conveyors, it follows that one and only one of the current comparators will set its output to the high digital state, while the other three current comparators will set their output to the low digital state.

Figure 10:
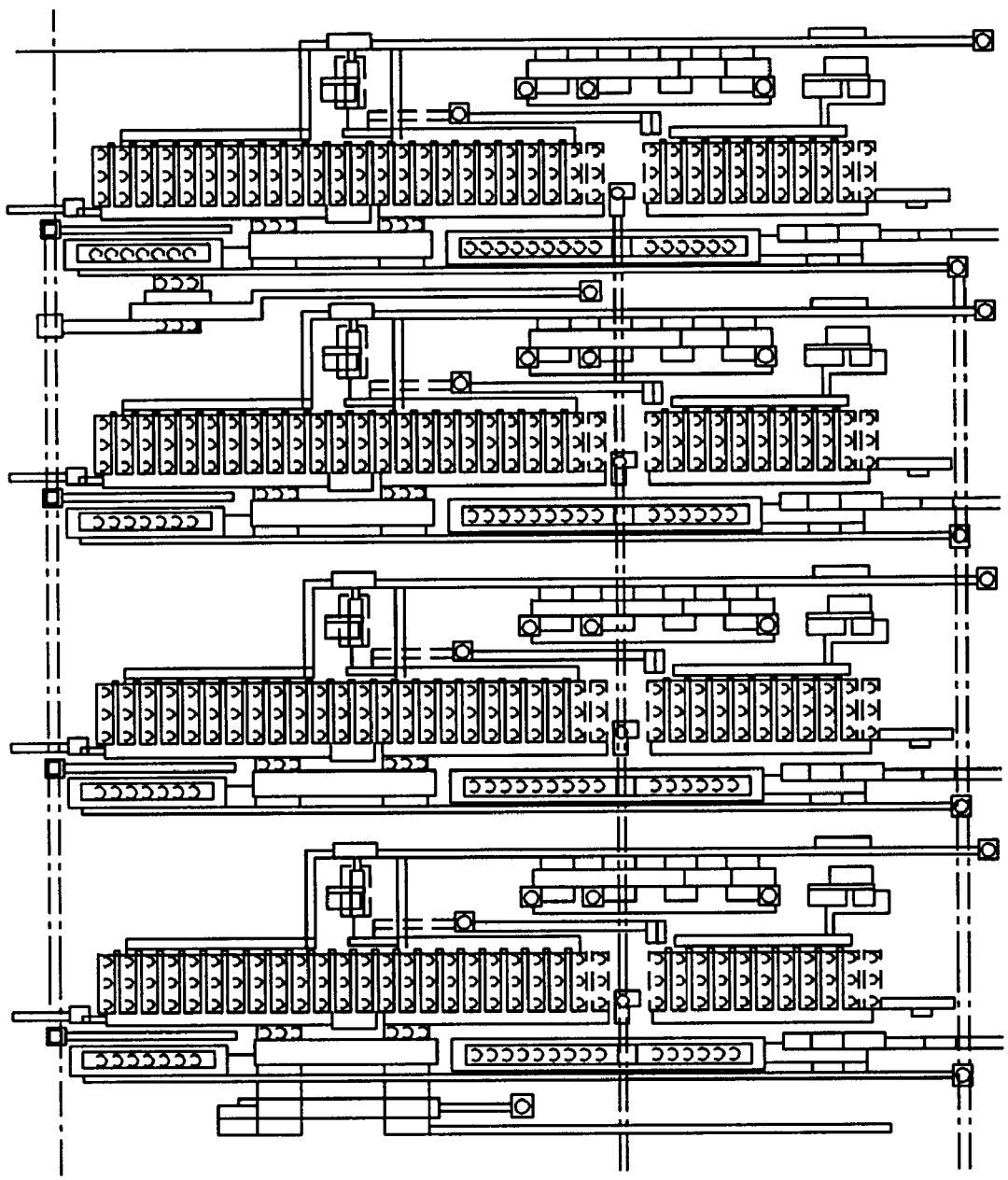
FIG. 10 shows the detailed layout of the Read-out architecture according to a preferred embodiment of the invention.

The circuit has been integrated in a standard doublepoly-silicon double-metal 0.7-$\mu$m process with a silicon area of only 140×100 $\mu m^2$, as shown in the picture of FIG. 10, and has been extensively evaluated. The silicon area for implementing a single 8-bit comparator is estimated to be around 70×50 $\mu m^2$. Since 3 comparators are needed, the classical architecture of FIG. 5 would take at least 210×150 $\mu m^2$ of silicon area and would result in a 'level identifying' block almost 2.3 times larger than the one proposed according to this invention. For power consumption in the same range, they show comparable propagation delay. However, in the circuit proposed here it is possible to significantly decrease the propagation delay simply by increasing the circuit biasing currents. This is not so straightforward in standard comparators where an increase of the biasing current would result in larger offset voltage and lower accuracy. The speed of the read-out and 'level identifying' circuitry significantly influences the data throughput of the memory due to the program verify schemes that are normally utilized in MLCS.

Figure 11:
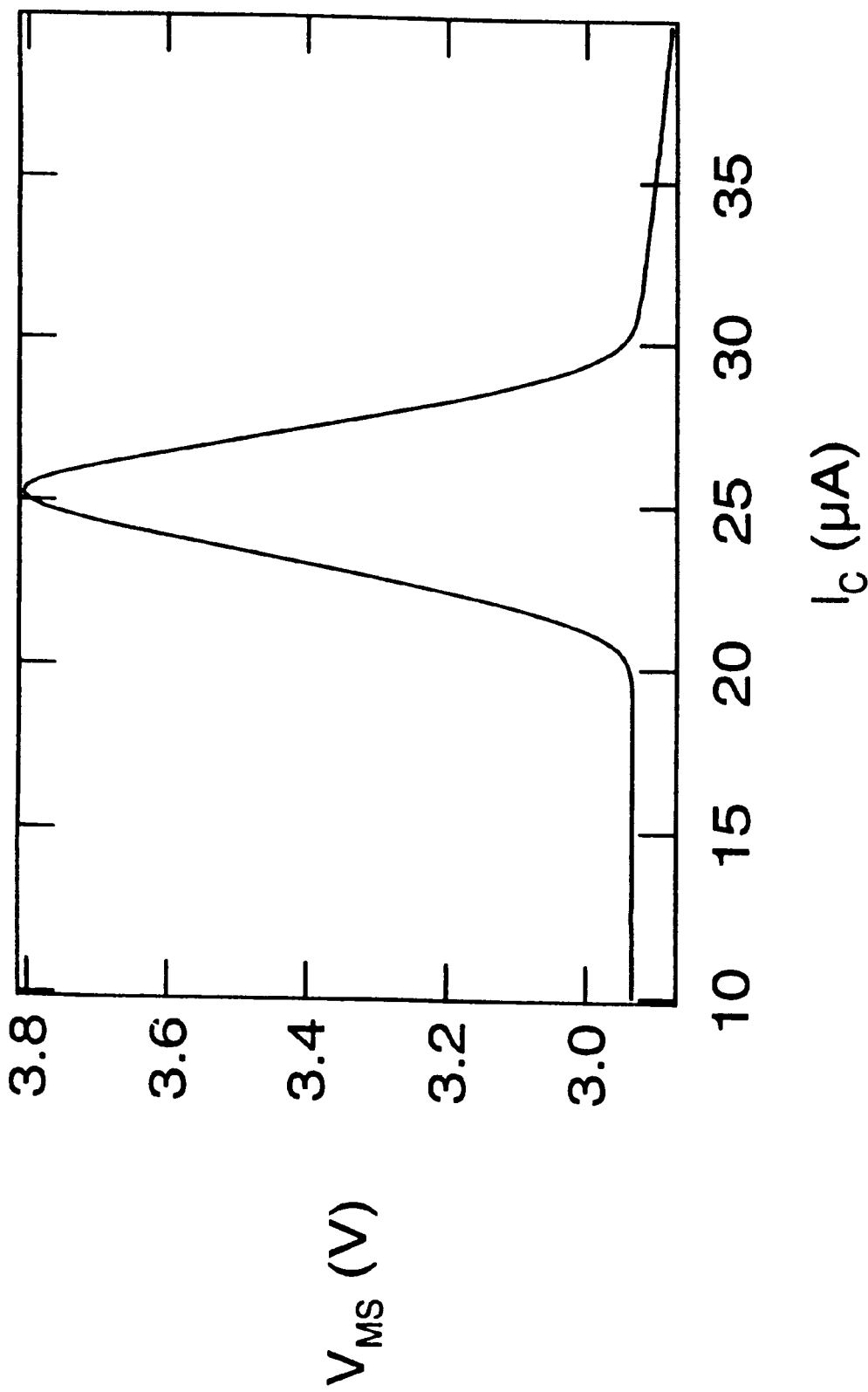
FIG. 11 is a graph which shows experimental results representative for subcircuits 400, 401, 402 and 403.
Figure 12:
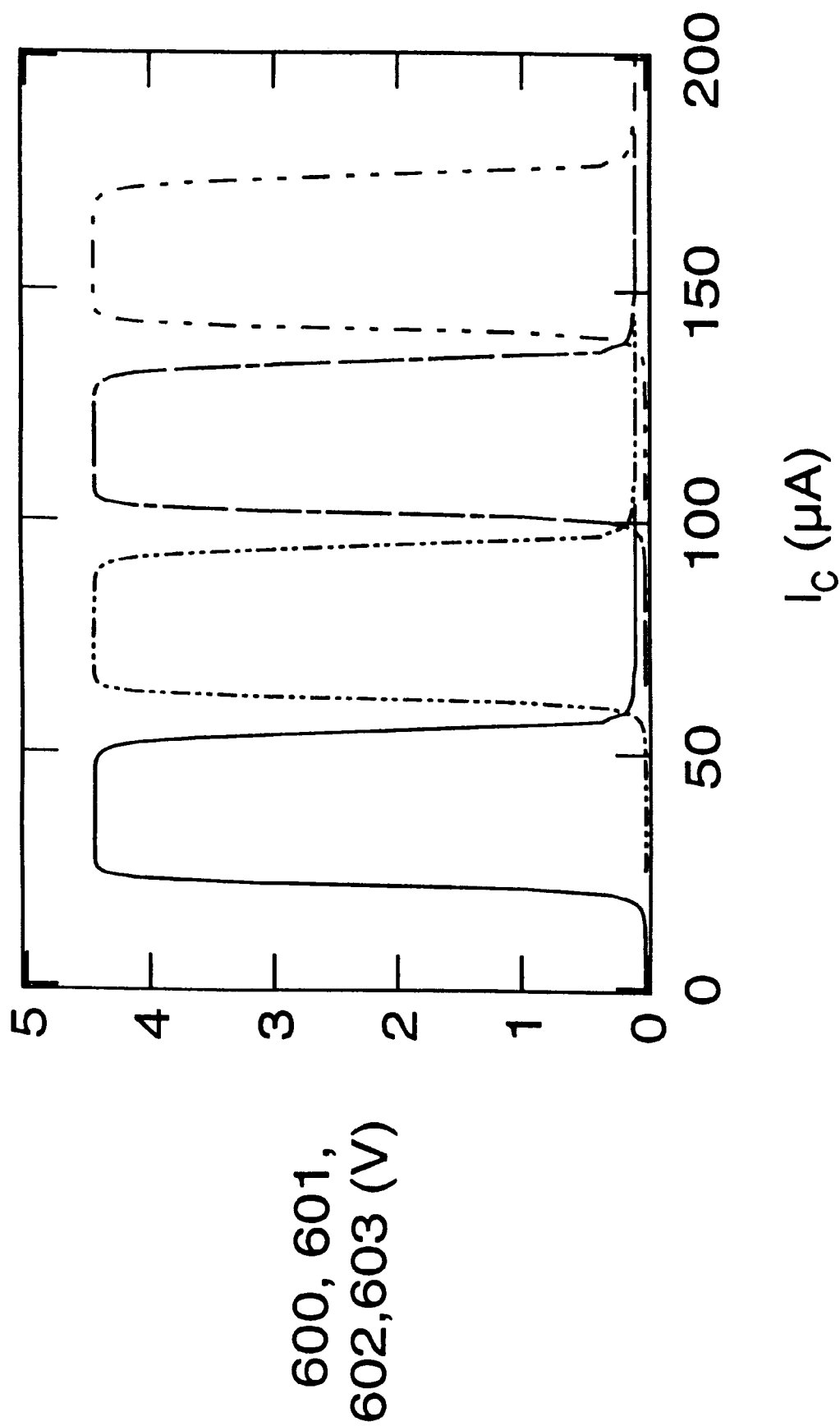
FIG. 12 is a graph which shows experimental results of the Read-out architecture according to a preferred embodiment of the invention.

FIG. 11 shows the experimentally evaluated VMS as a function of a sweeping cell current in the case of a reference current of 25 $\mu A$; as expected, the better the current match, the higher VMS. FIG. 12 shows the experimental output voltages of the read-out circuit as a function of a sweeping cell current in the case of reference currents of 30, 80, 120 and 160 $\mu A$. Only one output voltage is high for any given cell current value.

Each time the memory device is flash erased, for instance before a write operation, the dummy cells belonging to that particular sector are erased as well and reprogrammed to the reference levels. This technique ensures that both the dummy and the memory cells experience the very same duty cycle and, therefore, the same current shifts. This means that the overall shift due to cycling cancels out when comparing dummies and memory cells during read-out. Repeating the dummy cells on each wordline eliminates another effect that plays an important role in high density memories: the drain resistance effect. Due to the resistive nature of the drain line, there is a difference in the read-out currents of the cells belonging to the same column. This difference, although negligible for memory cells which are close to each other, could become quite large for spaced-apart cells and should not be taken into account if the dummy cells are not on the same row as the cell to be read-out. The additional cost in terms of silicon area of such an architecture is very limited since it comprises only four cells per wordline.

Although other modifications and changes may be suggested by those skilled in the art, it is the intention of the inventor to embody within the patent warranted hereon all changes and modifications as reasonably and properly come within the scope of his contribution to the art.

We claim:

1. The memory device adapted for multi-level charge storage, comprising:
   a plurality of flash EEPROM memory cells including a source region, a drain region, a channel region and a floating gate, said floating gate including first and second floating gate portions, said first floating gate portion extending over said channel region, said second floating gate portion extending away from said channel region, said flash EEPROM memory cells further including a program gate and a control gate, said program gate forming a capacitor with said second floating gate portion;

readout means for parallel outputting binary data corresponding to charge levels stored in said flash EEPROM memory cells; and programming means for applying a low voltage to said control gate, for applying a voltage not greater than 5 Volts to said drain region and for applying a high voltage pulse with a predetermined amplitude, selected from a plurality of predetermined amplitudes and with an essentially fixed time width to said program gate, said predetermined amplitudes determining said charge levels, said plurality of flash EEPROM memory cells being arranged in an array with rows and columns having drains of the flash EEPROM memory cells belonging to a same column connected together whereby forming a data output line;

the program gates of the flash EEPROM memory cells belonging to the same column being connected together whereby forming a data input line; and the control gates of the flash EEPROM memory cells belonging to the same row being connected together whereby forming a word line, said data input line and said data output line being essentially parallel and routed in a same direction; and said word line being routed in a direction that is essentially perpendicular to a direction of said data input line and said data output line, wherein said array further comprises:

dummy cells on essentially each row of the array, said dummy cells providing reference currents in readout operation.

2. A method of storing and reading out one of a plurality of charge levels in a memory cell of a memory device adapted for multi-level charge storage, said memory cell including a source region, a drain region, a channel region and a floating gate, said floating gate including first and second floating gate portions, said first floating gate portion extending over said channel region, said second floating gate portion extending away from said channel region, said memory cell further including a program gate and a control gate, said program gate forming a capacitor with said second floating gate portion, said method comprising the steps of:

storing charge levels including:
applying a low voltage to said control gate;
applying a voltage not greater than 5 Volts to said drain region;
applying a high voltage pulse with a predetermined amplitude, selected from a plurality of predetermined amplitudes and with an essentially fixed time width to said program gate, said predetermined amplitudes determining said charge levels;

reading out charge levels including:
sensing drain current of said memory cell;
sensing drain currents of a plurality of dummy cells;
measuring similarities between said drain current of said memory cell and said drain currents of said plurality of dummy cells to obtain a plurality of intermediate voltages representing said similarities;

determining a highest among said intermediate voltages to identify the dummy cell having the drain current closest to the drain current of said memory cell; and setting a predetermined voltage on one of a plurality of output terminals, said one output terminal corresponding to said dummy cell having the drain current closest to the drain current of said memory cell.

3. The method as recited in claim 2, further comprising the step of: erasing said memory cell.

4. The method as recited in claim 3,
wherein essentially each of said memory cells of said device is erased, and
wherein said step of erasing said memory cells comprises the steps of:
applying a low voltage to said control gates of essentially each of said cells of said array;
applying a voltage not greater than 5 volts on said drain regions of essentially each of said cells of said array; and
applying a high voltage pulse with a predetermined amplitude and an essentially fixed time width on said program gates of essentially each of said cells of said array; and
thereafter executing the steps as recited in claim 3.

5. The method as recited in claim 2, wherein said high voltage pulse is capacitively coupled to said second floating gate portion, thereby causing a hot-electron injection towards said floating gate so that the charge level is stored in said memory cell.

6. The method as recited in claim 5, wherein said memory cell is implemented in a 0.7 μm CMOS technology, said low voltage is smaller than or equal to 1.5 Volt and said high voltage pulse being selected from the predetermined amplitudes 12 Volts, 8 Volts, or 7 Volts, and 0 volt, said width being about 1 microsecond.

7. A method of reading out the charge level of a memory cell of a memory device, said memory cell comprising a cell having a source region, a drain region, a channel region and a floating gate, said floating gate including first and second floating gate portions, said first floating gate portion extending over said channel region, said second floating gate portion extending away from said channel region, said memory cell further including a program gate and a control gate, said program gate forming a capacitor with said second floating gate portion, said method comprising the steps of:

drain current of said memory cell;
sensing drain currents of a plurality of dummy cells;
measuring similarities between said drain current of said memory cell and said drain currents of said plurality of dummy cells to obtain a plurality of intermediate voltages representing said similarities;
determining a highest among said intermediate voltages to identify the dummy cell having the drain current closest to the drain current of said memory cell;
setting a predetermined voltage on one of a plurality of output terminals, said one output terminal corresponding to said dummy cell having the drain current closest to the drain current of said memory cell.

8. An apparatus for reading out charge level of a memory cell of a memory device, said memory cell including a source region, a drain region, a channel region and a floating gate, said floating gate including first and second floating gate portions, said first floating gate portion extending over said channel region, said second floating gate portion extending away from said channel region, said memory cell further including a program gate and a control gate, said program gate forming a capacitor with said second floating gate portion, the apparatus comprising:

a plurality of dummy cells for delivering a plurality of reference currents;

means for reading out said reference currents and current of said memory cell;

a plurality of analog circuits for measuring similarity between said current of said memory cell and each of said reference currents to output a plurality of intermediate voltages representing said similarities;

a plurality of output terminals;

a decision circuit for determining a highest among said intermediate voltages to determine the dummy cell having drain current with a smallest distance from drain current of said memory cell and for setting a predetermined voltage on one of said plurality of output terminals, said one output terminal corresponding to said dummy cell having the drain current with a smallest distance from the drain current of said memory cell.

9. The apparatus as recited in claim 8, wherein said similarity is measured as a Euclidean distance between said current of said memory cell and each of said reference currents.

10. The apparatus as recited in claim 9, wherein said analog circuits comprise: a long channel metal-oxide-semiconductor transistor.

11. The apparatus as recited in claim 9, wherein said analogue circuits comprise:

a couple of first driving metal-oxide-semiconductor transistors;

a couple of second metal-oxide-semiconductor transistors, one electrode of each of said second metal-oxide-semiconductor transistors being connected to one electrode of one of said first driving metal-oxide-semiconductor transistors, one of said first driving metal-oxide-semiconductor transistors thereby being connected to one of said second metal-oxide-semiconductor transistors, a gate of each of said first driving metal-oxide-semiconductor transistors being connected to a gate of one of said second metal-oxide-semiconductor transistors, the second metal oxide-semiconductor transistor being the one that is not connected with one electrode of said first driving metal-oxide-semiconductor transistors, the gates of said first driving metal-oxide-semiconductor transistors and said second metal-oxide-semiconductor transistors thereby being configured in a cross-like configuration; and a third metal-oxide-semiconductor transistor being connected to another electrode of said first driving metal-oxide-semiconductor transistors, said another electrodes of said first driving metal-oxide-semiconductor transistors being connected.

12. The apparatus as recited in claim 11, wherein a gate of said third metal-oxide-semiconductor transistor is short-circuited with an electrode of said third metal-oxide-semiconductor transistor that is connected to said first metal-oxide-semiconductor transistors.

13. The apparatus as recited in claim 12, wherein said first driving metal-oxide-semiconductor transistors are n-MOS transistors, said one electrode being a source of said first driving metal-oxide-semiconductor transistors, and said other electrode of said first driving metal-oxide-semiconductor transistors being a drain of said first driving metal-oxide-semiconductor transistors, said third metal-oxide-semiconductor transistor being a p-MOS transistor.

14. The apparatus as recited in claim 11, wherein said second metal-oxide semiconductor transistors have an aspect ratio W/L which is about 10 times an aspect ratio W/L of said first metal-oxide-semiconductor transistors.

15. The apparatus as recited in claim 8, wherein said decision circuit comprises a plurality of current conveyor transistors and current comparators, said current conveyor transistors having one electrode being connected to a same current biasing source, the gate electrode of said current conveyors being modulated by said intermediate voltages.

* * * * *